(12) United States Patent
Hu et al.

(10) Patent No.: US 10,945,341 B2
(45) Date of Patent: Mar. 9, 2021

(54) FLEXIBLE DISPLAY SCREEN AND FLEXIBLE DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Xiaorui Hu, Beijing (CN); Guowen Yang, Beijing (CN); Zhouping Wang, Beijing (CN); Tao Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 337 days.

(21) Appl. No.: 15/994,128

(22) Filed: May 31, 2018

(65) Prior Publication Data
US 2019/0045640 A1    Feb. 7, 2019

(30) Foreign Application Priority Data
Aug. 3, 2017    (CN) .......................... 201710656422.8

(51) Int. Cl.
   H05K 5/00    (2006.01)
   H05K 5/03    (2006.01)
   G09F 9/30    (2006.01)
(52) U.S. Cl.
   CPC .......... H05K 5/0017 (2013.01); G09F 9/301 (2013.01); H05K 5/03 (2013.01)

(58) Field of Classification Search
   CPC ......... H05K 5/0017; H05K 5/03; G09F 9/301
   See application file for complete search history.

(56) References Cited

U.S. PATENT DOCUMENTS 9,314,885 B2 *    4/2016    Chen ..................... B23P 11/00
2015/0255704 A1    9/2015    Kim et al.
(Continued)

FOREIGN PATENT DOCUMENTS

CN    101413630 A    4/2009
CN    104006357 A    8/2014
(Continued)

OTHER PUBLICATIONS

The First Chinese Office Action dated Mar. 11, 2019; Appln. No. 201710656422.8.

*Primary Examiner* — Joanna Pleszczynska

(57) ABSTRACT

Embodiments of the present disclosure provide a flexible display screen and a flexible display device. The flexible display screen includes a display screen body and a deformation component disposed on a back side of the display screen body, wherein when an ambient temperature is higher than a first temperature threshold value, the deformation component is deformed towards a direction in which the display screen body reveals curved display; when the ambient temperature is lower than a second temperature threshold value, the deformation component is deformed towards a direction in which the display screen body reveals flat display; and the second temperature threshold value is not greater than the first temperature threshold value.

7 Claims, 2 Drawing Sheets

(56) References Cited

U.S. PATENT DOCUMENTS

| | | | |
|---|---|---|---|
| 2016/0299283 A1 | 10/2016 | Yu et al. | |
| 2017/0212556 A1* | 7/2017 | Jovanovic | ........... H01L 51/5237 |
| 2017/0285407 A1 | 10/2017 | Zhu et al. | |
| 2018/0040803 A1 | 2/2018 | Park et al. | |
| 2018/0323385 A1 | 11/2018 | Liu et al. | |

FOREIGN PATENT DOCUMENTS

| | | | |
|---|---|---|---|
| CN | 104620495 A | 5/2015 |
| CN | 105228335 A | 1/2016 |
| CN | 105867021 A | 8/2016 |
| CN | 106168921 A | 11/2016 |
| CN | 106875850 A | 6/2017 |

\* cited by examiner

FLEXIBLE DISPLAY SCREEN AND FLEXIBLE DISPLAY DEVICE

TECHNICAL FIELD

The present disclosure relates to a flexible display screen and a flexible display device.

BACKGROUND

Flexible display screen has the characteristics of being light and thin, impact resistant, and flexible, which are not available in many conventional displays, so that the display device can be lighter and thinner, portable, and beautiful and stylish, providing a broader space for development. Therefore, in the display fields of electronic paper (e-paper), active matrix organic light-emitting diode (AMOLED) and the like, flexible display technology represented by flexible display screen has received extensive attention and research.

Deformation of the flexible display screen must be performed under certain temperature condition. When the temperature is low, the brittleness of the flexible display screen will increase. If the flexible display screen is randomly deformed at a low temperature, the reliability and service life of a screen will be seriously affected, and the screen will be even subjected to brittle damage. On this basis, a technical problem to be urgently solved at present is how to realize the deformation control of the flexible display screen at different temperatures and then reduce the risk of damage to the flexible display screen.

SUMMARY

Embodiments of the present disclosure provide a flexible display screen and a flexible display device.

An embodiment of the present disclosure provides a flexible display screen, comprising a display screen body and a deformation component disposed on a back side of the display screen body, wherein when an ambient temperature is higher than a first temperature threshold value, the deformation component is deformed towards a direction in which the display screen body reveals curved display; when the ambient temperature is lower than a second temperature threshold value, the deformation component is deformed towards a direction in which the display screen body reveals flat display; and the second temperature threshold value is not greater than the first temperature threshold value.

For example, the deformation component is a deformation component with shape memory effect.

For example, the deformation component is a planar deformation component arranged on the back side of the display screen body; and the memory temperature of the planar deformation component, the first temperature threshold value and the second temperature threshold value are equal to each other.

For example, the deformation component is a plurality of planar deformation components arranged on the back side of the display screen body and spaced from each other; and the memory temperature of the planar deformation components, the first temperature threshold value and the second temperature threshold value are equal to each other.

For example, the deformation component includes a main deformation component arranged corresponding to a display region of the display screen body and an annular component arranged along an edge of the display screen body.

For example, the main deformation component includes a plurality of deformation units uniformly arranged on the back side of the display screen body; and the memory temperature of the deformation units is equal to the memory temperature of the annular component, the first temperature threshold value and the second temperature threshold value.

For example, the main deformation component includes at least two groups of deformation units with different memory temperatures; the at least two groups of deformation units are respectively disposed in different regions on the back side of the display screen body; the memory temperature of one group of deformation units with highest memory temperature is the first temperature threshold value; the memory temperature of one group of deformation units with lowest memory temperature is the second temperature threshold value; when the ambient temperature is higher than the first temperature threshold value, the at least two groups of deformation units are respectively deformed towards directions in which corresponding regions of the display screen body are curved; when the ambient temperature is higher than the second temperature threshold value and lower than the first temperature threshold value, the one group of deformation units with the lowest memory temperature are deformed towards the direction in which the corresponding region of the display screen body is curved, and the one group of deformation units with the highest memory temperature are deformed towards a direction in which the corresponding region of the display screen body is straightened; and when the ambient temperature is lower than the second temperature threshold value, the at least two groups of deformation units are respectively deformed towards the directions in which the corresponding regions of the display screen body are straightened.

For example, the memory temperature of the one group of deformation units with the lowest memory temperature is equal to the memory temperature of the annular component.

For example, the main deformation component includes two groups of deformation units which are respectively a first group of deformation units and a second group of deformation units; a memory temperature of the first group of deformation units is greater than a memory temperature of the second group of deformation units; the first group of deformation units include first deformation strips and second deformation strips which are intersected with each other to define a plurality of sub-regions; and the second group of deformation units include subunits which are respectively disposed in each of the plurality of sub-regions.

For example, the first deformation strips are arranged along a long-side direction of the display screen body, and the second deformation strips are arranged along a short-side direction of the display screen body; and/or the subunits are herringbone subunits.

For example, the memory temperature of the first group of deformation units is 0° C.; and the memory temperature of the second group of deformation units and the annular component is set to be −10° C.

For example, a material of the deformation component is memory alloy; or the material of the deformation component is memory rubber.

For example, the plurality of deformation units are formed in strip-shaped and planar-shaped.

An embodiment of the present disclosure provides the flexible display device, comprising the flexible display screen as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not imitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

In order to realize the deformation control of the flexible display screen at different temperatures and then reduce the risk of damage to the flexible display screen, embodiments of the present disclosure provides a flexible display screen and a flexible display device. Further detailed description will be given to the following embodiments for more clear understanding the present disclosure.

Figure 1:
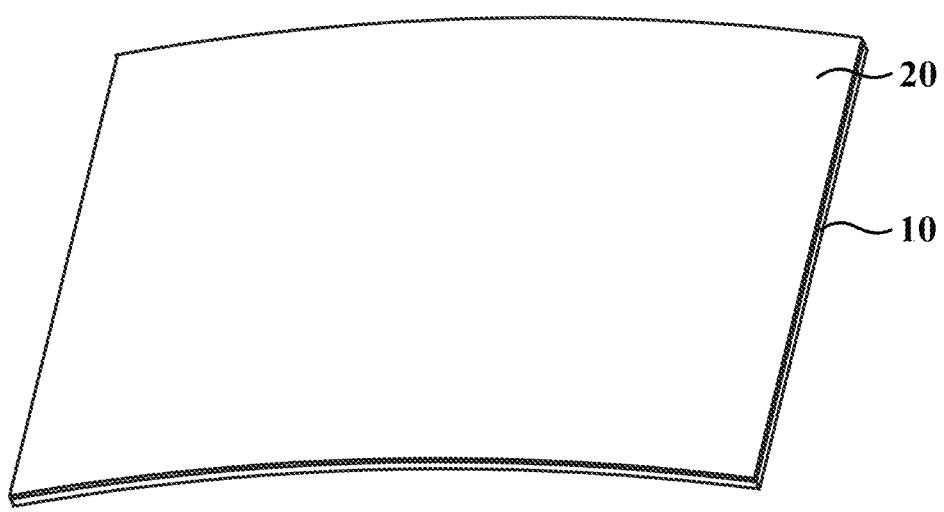
FIG. 1 is a schematic structural view of a flexible display screen provided by an embodiment of the present disclosure.

As illustrated in FIG. 1, the flexible display screen provided by an embodiment of the present disclosure comprises a display screen body 10 and a deformation component 20 disposed on a back side of the display screen body 10. When the ambient temperature is higher than a first temperature threshold value, the deformation component 20 is deformed towards a direction in which the display screen body 10 reveals curved display. When the ambient temperature is lower than a second temperature threshold value, the deformation component 20 is deformed towards a direction in which the display screen body 10 reveals flat display. The second temperature threshold value is not greater than the first temperature threshold value.

Herein, specific values of the first temperature threshold value and the second temperature threshold value are not limited and may be set according to temperature characteristics of the display screen body 10. The temperature characteristics of the display screen body 10 with different manufacturing processes or different dimensions will have difference and must be determined according to specific conditions.

In the technical solution of an embodiment of the present disclosure, by utilization of the shape memory effect of the deformation component 20, when the ambient temperature is higher than the first temperature threshold value, the flexibility of the display screen body 10 at this temperature is good, and at this point, the deformation component 20 will be curved and drive the display screen body 10 to be curved together, so as to realize the curved display of the display screen body 10. When the ambient temperature is lower than the second temperature threshold value, the brittleness of the flexible display screen body 10 will be increased. In order to avoid the damage to the flexible display screen due to random deformation at this temperature, at this point, the deformation component 20 will drive the display screen body 10 to be straightened, so that the display screen body 10 reveals flat display. Therefore, the solution can realize the deformation control of the flexible display screen at different temperatures and then reduce the risk of damage to the flexible display screen.

Herein, a material of the deformation component 20 is not limited and, for instance, may be memory alloy or memory rubber.

Taking memory alloy as an example, the shape memory effect of the memory alloy shall be as follows: the memory alloy shows a first structural form above a memory temperature and shows a second structural form below the memory temperature. When the ambient temperature is above the memory temperature, a crystal structure in the memory alloy will be changed, making the memory alloy to deform, and at this point, the memory alloy is embodied as the first structure. When the ambient temperature is reduced to the temperature below the memory temperature, crystals in the memory alloy are restored to the original structure, and the memory alloy is embodied as the second structure. In the embodiment of the present disclosure, according to a preset curved shape of the flexible display screen body 10 while revealing curved display, the memory alloy may be processed into the first structural form matched with the above curved shape when the temperature is above the memory temperature, and then the display screen body 10 will be driven by the memory alloy to be deformed according to the curved shape.

As shown in FIG. 1, in an embodiment of the present disclosure, the deformation component 20 is a planar deformation component laid on the back side of the display screen body 10, and the memory temperature of the planar deformation component, the first temperature threshold value and the second temperature threshold value are equal to each other. By adoption of the technical solution, the planar deformation component may apply more balanced acting force to the display screen body 10, so as to improve the deformation control ability of the deformation component on the display screen body and reduce the risk of damage to the flexible display screen.

Figure 2:
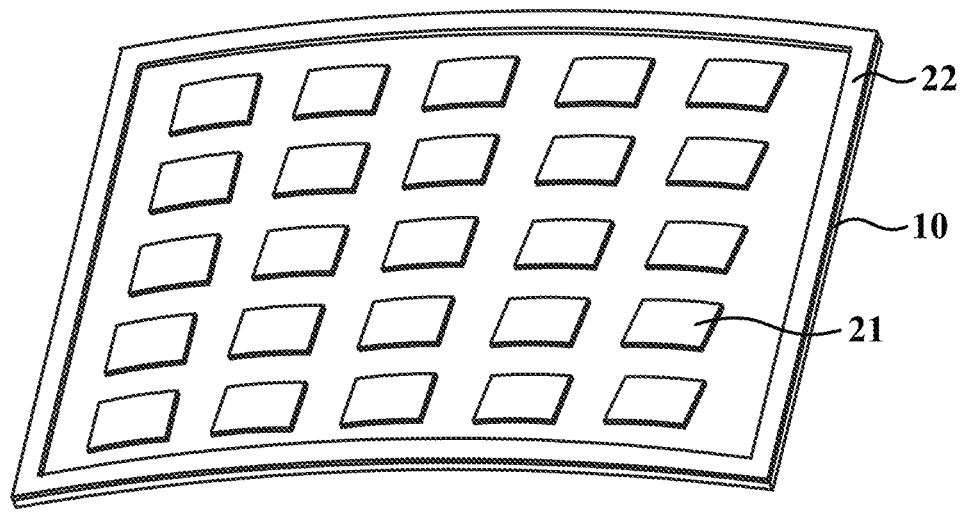
FIG. 2 is a schematic structural view of a flexible display screen provided by another embodiment of the present disclosure.

As shown in FIG. 2, in another embodiment of the present disclosure, the deformation component 20 includes a main deformation component 21 arranged corresponding to a display region of the display screen body and an annular component 22 arranged along an edge of the display screen body. In order to avoid distorting of an overall shape of the display screen body in the case of displaying, the display region and an edge region of the display screen body must be synchronously curved or straightened. By adoption of the solution of the embodiment, the combined action of the main deformation component 21 and the annular component 22 may be utilized to drive the display screen body to show different display states.

In an embodiment of the present disclosure, the main deformation component includes a plurality of deformation units 21 uniformly arranged on the back side of the display screen body, and the memory temperature of the deformation units 21 is equal to the memory temperature of the annular component 22, the first temperature threshold value and the second temperature threshold value. By adoption of the solution of the embodiment, the deformation units 21 and the annular component 22 have same memory temperature. When the ambient temperature is higher than the memory temperature, the main deformation component and the annular component 22 are respectively deformed towards directions in which corresponding regions of the display screen body 10 are curved, so that the display screen body 10 reveals curved display. When the ambient temperature is lower than the memory temperature, the main deformation component and the annular component 22 are respectively deformed towards directions in which corresponding regions of the display screen body 10 are straightened, so that the display screen body 10 reveals flat display.

For instance, the plurality of deformation units may be planar, strip-shaped, etc.

In an embodiment of the present disclosure, the main deformation component includes at least two groups of deformation units with different memory temperatures; the at least two groups of deformation units are respectively disposed in different regions on the back side of the display screen body; the memory temperature of one group of deformation units with the highest memory temperature is the first temperature threshold value; the memory temperature of one group of deformation units with the lowest memory temperature is the second temperature threshold value.

When the ambient temperature is higher than the first temperature threshold value, the at least two groups of deformation units are respectively deformed towards the directions in which corresponding regions of the display screen body are curved;

When the ambient temperature is higher than the second temperature threshold value and lower than the first temperature threshold value, one group of deformation units with the lowest memory temperature is deformed towards the direction in which corresponding region of the display screen body is curved, and one group of deformation units with the highest memory temperature is deformed towards the direction in which corresponding region of the display screen body is straightened; and when the ambient temperature is lower than the second temperature threshold value, the at least two groups of deformation units are respectively deformed towards the directions in which corresponding regions of the display screen body are straightened.

By adoption of the technical solution, the main deformation component includes at least two groups of deformation units with different memory temperatures. The at least two groups of deformation units with different memory temperatures may respectively drive the display screen body to show different display states under corresponding temperature conditions, thus allowing the flexible display to have a plurality of curved display effects on the premise of reducing the risk of damage to the flexible display screen, and improving the use experience of users.

Illustratively, the memory temperature of one group of deformation units with the lowest memory temperature is equal to the memory temperature of the annular component. When the ambient temperature is higher than the first temperature threshold value, the annular component may be synchronously curved with the at least two groups of deformation units. When the ambient temperature is higher than the second temperature threshold value and lower than the first temperature threshold value, one group of deformation units with the lowest memory temperature is deformed towards the direction in which corresponding region of the display screen body is curved, the annular component will be still synchronously curved with one group of deformation components with the lowest memory temperature, so as to avoid distorting of the overall shape of the display screen body in the case of displaying and reduce the risk of damage to the flexible display screen.

Figure 3:
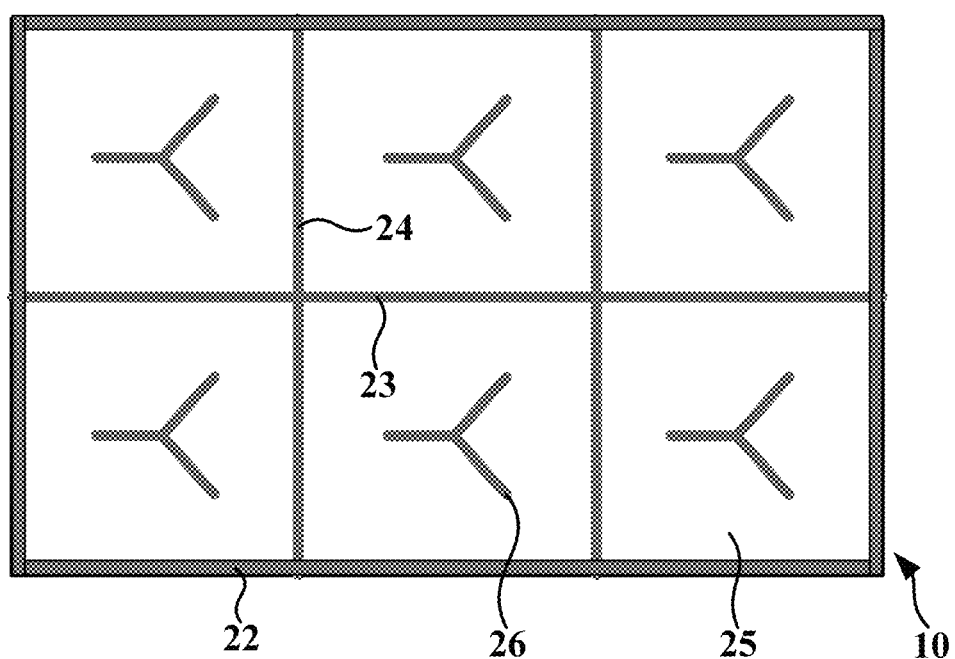
FIG. 3 is a schematic structural view illustrating a back side of a display screen body in the embodiment of the present disclosure.

As shown in FIG. 3, the main deformation component includes two groups of deformation units which are respectively a first group of deformation units and a second group of deformation units. The memory temperature of the first group of deformation units is greater than the memory temperature of the second group of deformation units. The first group of deformation units include first deformation strips 23 and second deformation strips 24 which are intersected with each other to define a plurality of sub-regions 25. The second group of deformation units include subunits 26 which are respectively disposed in each sub-region 25.

Wherein, specific arrangement directions of the first deformation strips 23 and the second deformation strips 24 are not limited. For instance, the first deformation strips 23 are arranged along a long-side direction of the display screen body 10, and the second deformation strips 24 are arranged along a short-side direction of the display screen body 10. The specific number of the first deformation strips 23 and the second deformation strips 24 is not limited. The number of the first deformation strips 23 and the second deformation strips 24 may be reduced as much as possible on the premise of ensuring that the acting force applied by the first group of deformation units to the display screen body 10 can drive the display screen body 10 to be curved or straightened. The specific shape of the subunits 26 is not limited. In an embodiment of the present disclosure, the subunits 26 may be herringbone subunits, so as to increase the range of action of the acting force applied by the subunits 26 to the display screen body 10.

In an embodiment of the present disclosure, the memory temperature of the first group of deformation units may be set to be 0° C., and the memory temperature of the second group of deformation units and the annular component may be set to be −10° C. Thus, according to the arrangement manner of the first group of deformation units and the second group of deformation units, when the ambient temperature is higher than 0° C., the first group of deformation units and the second group of deformation units are respectively deformed towards the directions in which corresponding regions of the display screen body are curved, so that the display screen body reveals curved display state of being curved within a large range. When the ambient temperature is higher than −10° C. and lower than 0° C., the second group of deformation units are deformed towards the direction in which each sub-region is curved, so that the display screen body can reveal the curved display state of being curved within a small range. When the ambient temperature is lower than −10° C., the first group of deformation units and the second group of deformation units are respectively deformed towards the directions in which corresponding regions of the display screen body are straightened, so that the display screen body can reveal flat display state.

An embodiment of the present disclosure further provides a flexible display device, which comprises the flexible display screen provided by any foregoing technical solution. The quality of the flexible display device can be improved.

In the technical solution of the embodiment of the present disclosure, by utilization of the shape memory effect of the deformation component, when the ambient temperature is higher than the first temperature threshold value, the display screen body has good flexibility under this temperature condition, and at this point, the deformation component will be curved and drive the display screen body to be curved together, so as to realize the curved display of the display screen body. When the ambient temperature is lower than the second temperature threshold value, the brittleness of the display screen body will be increased. In order to avoid the damage to the flexible display screen due to random deformation under this temperature condition, at this point, the deformation component will drive the display screen body to show straightened state, so as to realize the flat display of the display screen body. Therefore, the solution of embodiments of the present disclosure can realize the deformation control of the flexible display screen at different temperatures and then reduce the risk of damage to the flexible display screen.

What are described above is related to the specific embodiments of the disclosure only and not limitative to the scope of the disclosure. The protection scope of the disclosure shall be based on the protection scope of the claims.

The application claims priority to the Chinese patent application No. 201710656422.8, filed Aug. 3, 2017, the disclosure of which is incorporated herein by reference as part of the application.

The invention claimed is:

1. A flexible display screen, comprising a display screen body and a deformation component disposed on a back side of the display screen body,
    wherein when an ambient temperature is higher than a first temperature threshold value, the deformation component is deformed towards a direction in which the display screen body reveals curved display;
    when the ambient temperature is lower than a second temperature threshold value, the deformation component is deformed towards a direction in which the display screen body reveals flat display; and the second temperature threshold value is not greater than the first temperature threshold value,
    wherein the deformation component is a deformation component with shape memory effect,
    wherein the deformation component includes a main deformation component arranged corresponding to a display region of the display screen body and an annular component arranged along an edge of the display screen body,
    wherein the main deformation component includes two groups of deformation units which are respectively a first group of deformation units and a second group of deformation units with different memory temperatures; a memory temperature of the first group of deformation units is greater than a memory temperature of the second group of deformation units; the first group of deformation units and the second group of deformation units are respectively disposed in different regions on the back side of the display screen body; the memory temperature of the first group of deformation units with highest memory temperature is the first temperature threshold value; the memory temperature of the second group of deformation units with lowest memory temperature is the second temperature threshold value;
    when the ambient temperature is higher than the first temperature threshold value, the two groups of deformation units are respectively deformed towards directions in which corresponding regions of the display screen body are curved;
    when the ambient temperature is higher than the second temperature threshold value and lower than the first temperature threshold value, the second group of deformation units with the lowest memory temperature are deformed towards the direction in which the corresponding region of the display screen body is curved, and the first group of deformation units with the highest memory temperature are deformed towards a direction in which the corresponding region of the display screen body is straightened; and
    when the ambient temperature is lower than the second temperature threshold value, the two groups of deformation units are respectively deformed towards the directions in which the corresponding regions of the display screen body are straightened,
    wherein the first group of deformation units include first deformation strips and second deformation strips which are intersected with each other to define a plurality of sub-regions; and the second group of deformation units include subunits which are respectively disposed in each of the plurality of sub-regions.

2. The flexible display screen according to claim 1, wherein the memory temperature of the second group of deformation units with the lowest memory temperature is equal to the memory temperature of the annular component.

3. The flexible display screen according to claim 1, wherein the first deformation strips are arranged along a long-side direction of the display screen body, and the second deformation strips are arranged along a short-side direction of the display screen body; and/or the subunits are herringbone subunits.

4. The flexible display screen according to claim 3, wherein the memory temperature of the first group of deformation units is 0° C.; and the memory temperature of the second group of deformation units and the annular component is set to be −10° C.

5. The flexible display screen according to claim 1, wherein a material of the deformation component is memory alloy; or the material of the deformation component is memory rubber.

6. The flexible display screen according to claim 1, wherein the deformation unit is strip-shaped or planar-shaped.

7. A flexible display device, comprising the flexible display screen according to claim 1.

* * * * *